US008445306B2

(12) United States Patent
Lindgren et al.

(10) Patent No.: US 8,445,306 B2
(45) Date of Patent: May 21, 2013

(54) HYBRID MEMS RF SWITCH AND METHOD OF FABRICATING SAME (75) Inventors: Peter J. Lindgren, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 1181 days.

(21) Appl. No.: 12/343,533

(22) Filed: Dec. 24, 2008

(65) Prior Publication Data
US 2012/0098136 A1    Apr. 26, 2012

(51) Int. Cl.
*H01L 21/00* (2006.01)
*H01L 29/84* (2006.01)

(52) U.S. Cl.
USPC ............................................ 438/52; 257/415

(58) Field of Classification Search
USPC ........ 438/22, 24, 48, 57, 73, 50–53; 257/415, 257/418; 29/622
See application file for complete search history.

(56) References Cited

U.S. PATENT DOCUMENTS

| 5,258,591 | A | * | 11/1993 | Buck ............................... 200/181 |
| 5,578,976 | A | * | 11/1996 | Yao ................................. 333/262 |
| 6,124,650 | A | * | 9/2000 | Bishop et al. ............ 310/40 MM |
| 6,127,812 | A | | 10/2000 | Ghezzo et al. |
| 6,605,043 | B1 | | 8/2003 | Dreschel et al. |
| 6,833,597 | B2 | | 12/2004 | Blasko, III |
| 6,872,984 | B1 | | 3/2005 | Leung |
| 6,953,985 | B2 | | 10/2005 | Lin et al. |
| 7,145,213 | B1 | | 12/2006 | Ebel et al. |
| 7,187,489 | B2 | | 3/2007 | Miles |
| 7,250,315 | B2 | | 7/2007 | Miles |
| 7,259,449 | B2 | | 8/2007 | Floyd |
| 7,265,429 | B2 | | 9/2007 | Wan |
| 7,348,870 | B2 | | 3/2008 | Hsu et al. |
| 7,368,311 | B2 | | 5/2008 | Tilmans et al. |
| 2003/0119221 | A1 | | 6/2003 | Cunningham et al. |
| 2005/0067633 | A1 | * | 3/2005 | Mushika ........................ 257/202 |
| 2007/0018761 | A1 | | 1/2007 | Yamanaka et al. |
| 2007/0108540 | A1 | * | 5/2007 | Cuxart .......................... 257/414 |
| 2008/0164542 | A1 | * | 7/2008 | Yang et al. .................... 257/415 |

FOREIGN PATENT DOCUMENTS
EP    1 777 721    4/2007

OTHER PUBLICATIONS

International Search Report and Written Opinion for corresponding International Application No. PCT/EP2009/063495, Dec. 28, 2009.

\* cited by examiner

*Primary Examiner* — Charles Garber
*Assistant Examiner* — Calvin Choi
(74) *Attorney, Agent, or Firm* — Anthony Canale; Roberts Mlotkowski Safran & Cole, P.C.

(57) ABSTRACT

Structures having a hybrid MEMS RF switch and method of fabricating such structures using existing wiring layers of a device is provided. The method of manufacturing a MEMS switch includes forming a forcing electrode from a lower wiring layer of a device and forming a lower electrode from an upper wiring layer of the device. The method further includes forming a flexible cantilever arm over the forcing electrode and the lower electrode such that upon application of a voltage to the forcing electrode, the flexible cantilever arm will contact the lower electrode to close the MEMS switch.

17 Claims, 9 Drawing Sheets

HYBRID MEMS RF SWITCH AND METHOD OF FABRICATING SAME

BACKGROUND

The invention relates to integrated circuits and methods of manufacturing the same, and more particularly, to structures having a hybrid MEMS RF switch and method of fabricating such structures using existing wiring layers of a device.

Integrated circuit switches used in 3D and other integrated circuits can be formed from solid state structures (e.g., transistors) or passive wires (MEMS). MEMS switches are typically employed because of their almost ideal isolation, which is a critical requirement for wireless radio applications where they are used for mode switching of power amplifiers (PAs).

MEMS can be manufactured in a number of ways using a number of different tools. In general, though, the methodologies and tools are used to form small structures with dimensions in the micrometer scale. Also, many of the methodologies, i.e., technologies, employed to manufacture MEMS have been adopted from integrated circuit (IC) technology. For example, almost all MEMS are built on wafers and are realized in thin films of materials patterned by photolithographic processes. More specifically, the fabrication of MEMS use three basic building blocks: (i) deposition of thin films of material on a substrate, (ii) applying a patterned mask on top of the films by photolithographic imaging, and (iii) etching the films selectively to the mask.

Depending on the particular application and engineering criteria, MEMS structures can come in many different forms. For example, MEMS can be realized in the form of a single cantilever structure such as, for example, shown in U.S. Pat. No. 5,578,976. In this cantilever application, a single cantilever arm (suspended electrode) is pulled toward a fixed electrode by application of a voltage. To manufacture such a cantilever structure, though, several extra and expensive processing steps are required, in addition to the building of the CMOS structure itself. For example, once all of the CMOS wiring is completed, additional processes steps are required to form the MEMS switch, which adds considerable processing costs to the structure.

Accordingly, there exists a need in the art to overcome the deficiencies and limitations described hereinabove.

SUMMARY

In an aspect of the invention, a method of manufacturing a MEMS switch comprises forming a forcing electrode from a lower wiring layer of a device and forming a lower electrode from an upper wiring layer of the device. The method further includes forming a flexible cantilever arm over the forcing electrode and the lower electrode such that upon application of a voltage to the forcing electrode, the flexible cantilever arm will contact the lower electrode to close the MEMS switch.

In embodiments, the forcing electrode and the lower electrode are copper wiring levels of the device. The forcing electrode is embedded in a dielectric layer formed by a damascene process. The lower electrode is formed by patterning a deposited layer of conductive material on a dielectric layer. The method further comprises depositing a gold layer on the conductive material forming the lower electrode prior to the patterning. The method further comprises depositing a refractory material between the conductive material forming the lower electrode and the gold layer prior to the patterning.

The flexible cantilever arm is formed by: depositing a sacrificial material, such as a polymer or silicon over a dielectric material and the lower electrode; and depositing a conductive material on the sacrificial material. The conductive material preferably is at least one of Cu, Au, TiN, and Al. The method further comprises hermetically sealing the flexible cantilever arm comprising: depositing a sacrificial layer on the flexible cantilever arm and on a sacrificial material used in the formation of the flexible cantilever arm; capping the sacrificial layer with a deposited hard cap material; opening holes in the hard cap material; stripping the sacrificial layer and the sacrificial material; and sealing the holes.

In an aspect of the invention, a method of manufacturing a MEMS structure comprises: forming a lower wiring layer in a lower dielectric layer; forming an upper wiring layer in an upper dielectric layer by deposition and patterning of a conductive material; depositing a sacrificial polymer material above the lower wiring layer and completely on one patterned wiring of the upper wiring layer and partially on another patterned wiring of the upper wiring layer; forming a cantilever arm by depositing a conductive material on the sacrificial polymer material which includes extending the conductive material over the lower wiring layer and in contact with the another patterned wiring of the upper wiring layer; and stripping or removing the sacrificial polymer material.

In an aspect of the invention, a MEMS switch comprises a lower wiring layer of a device acting as forcing electrode and an upper wiring layer of the device acting as a lower electrode contact. A high voltage, i.e. 10-200V, is applied to the forcing electrode to close the switch or compete the circuit for the MEMS switch. The MEMS switch further comprises a cantilever arm positioned above the forcing electrode and the lower electrode contact such that upon application of a voltage to the forcing electrode, the cantilever arm contacts the lower electrode contact to complete a circuit for the MEMS switch.

In embodiments, the MEMS switch is hermetically sealed. The hermetic seal is a SiN or SiCN cap layer that has sealed openings. The cantilever arm is at least one of Al, Cu, AlCu and Au and TiN. The cantilever arm is about 1-20, preferably 10 microns thick and spaced from the lower electrode contact at a distance of about 1-10, preferably 5 microns and the forcing electrode at a distance of about 2-15, preferably 8 microns.

In an aspect of the invention, a MEMS switch, comprises: a forcing electrode formed in a lower dielectric layer of a device; a patterned upper wiring layer of the device; and a cantilever arm configured to contact a first patterned wire of the patterned upper wiring layer and positioned proximate and over a second patterned wire of the patterned upper wiring layer and at a distance from the forcing electrode such that upon application of a voltage to the forcing electrode, the cantilever arm is forced into contact with the second patterned wire which acts as a lower electrode contact.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits, and more particularly, to structures having a hybrid MEMS RF switch and method of fabricating such structures using existing wiring layers of a device. In implementation, the invention includes methods and structures of several novel MEMS switches. The MEMS switches advantageously are fabricated using existing wiring levels. For example, in embodiments, the switches are fabricated using standard CMOS wiring levels, with additional processing to form a hermetic dome, e.g., hermetic SiN dome, over the switch. Additionally, in embodiments, the switch contact areas are cladded with thin gold, to prevent oxidization (i.e. permanently open switch) or stiction (i.e., permanently closed switch).

More specifically, the MEMS switches of the invention include a forcing electrode formed from a wiring layer (e.g., Cu last metal 'LM') of a CMOS wafer. The remaining electrodes such as the contact electrode and the bending (cantilever) electrode may be formed from a same conductor layer (e.g., Al, Cu) that is used to also form other wiring structures (e.g. wire, contact, etc.) and may have at least an upper or lower surface comprising a thin layer of gold for preventing corrosion. In embodiments, the present invention eliminates the need for specialized processes to form thick layers of gold (e.g. thick gold electroplating, lift-off processing, etc.), as the forcing electrode is not a gold layer formed on the last wiring level dielectric layer. By using existing wiring to form the MEMS switch, many additional processes steps are eliminated, thus reducing overall manufacturing costs of the MEMS switches. For simplicity, most of the discussion that follows is limited to a polymer for the sacrificial material; although other materials may be used with the present invention.

FIGS. 1-9 show structures and respective processing steps in accordance with aspects of the invention. FIG. 10 shows a final structure and respective processing steps in accordance with the first aspect of the invention. It should be recognized by those of skill in the art that with some modifications and/or additions to the processes described herein, e.g., patterning, metallization and/or deposition processes, the processes of FIGS. 1-9 can be used to fabricate any of the embodiments described herein. Although such modifications and/or additions should become obvious to those of skill in the art after an explanation of each of the embodiments, some further explanation of the additional and/or modified processes are described herein as necessary for a more thorough understanding of the invention.

Figure 1:
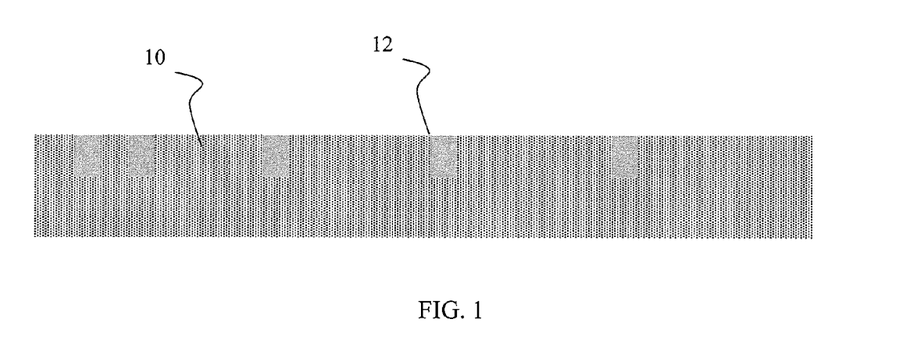
FIGS. 1-9 show intermediate structures and respective processing steps in accordance with aspects of the invention.

In particular, FIG. 1 shows a beginning structure comprising a layer of inter-metal dielectric 10. As should be understood by those of skill in the art, the dielectric material 10 may be an M+1 wiring level in an integrated circuit. Although not shown in FIG. 1, it should be understood that the dielectric material 10 may be provided on a wafer of any known type used with the formation of integrated circuits. For example, the wafer can be silicon, BULK, SOI, SiGe, quartz, glass or Gallium arsenide, to name a few; and could have a diameter of 75 mm 150 mm, 200 mm, 300 mm, 450 mm, etc. In embodiments, the dielectric layer 10 is $SiO_2$. The dielectric layer 10 could be deposited using any known method, such as plasma-enhanced chemical vapor deposition (PECVD).

Wires 12 are formed in the dielectric layer 10 using known methods. For example, a plurality of vias are formed using conventional lithographic processes. For example, a resist is deposited on the dielectric material 10 and selective portions of the resist are exposed to form openings. In subsequent processes, the dielectric material 10 is etched using a conventional process such as, for example, reactive ion etching (RIE) to form vias. The vias are filled with known metals or metal alloys to form the wires 12. The resist can be stripped away.

In embodiments, the wires 12 can be formed using dual damascene copper wire techniques. The wires 12 can also be metalized using any known combination of processes such as, for example, such as physical vapor deposition (PVD), chemical vapor deposition (CVD), electroplated deposition (ECP), metal-organo chemical vapor deposition (MOCVD), etc. In one exemplary embodiment, the wires can be tungsten plugs, with TiN liners. In another embodiment, the wires 12 are formed using copper with TaN/Ta liners. In another embodiment, the wires 12 are formed by a sub-etch AlCu process employing damascene tungsten vias or tapered AlCu vias between wiring levels.

Figure 2:
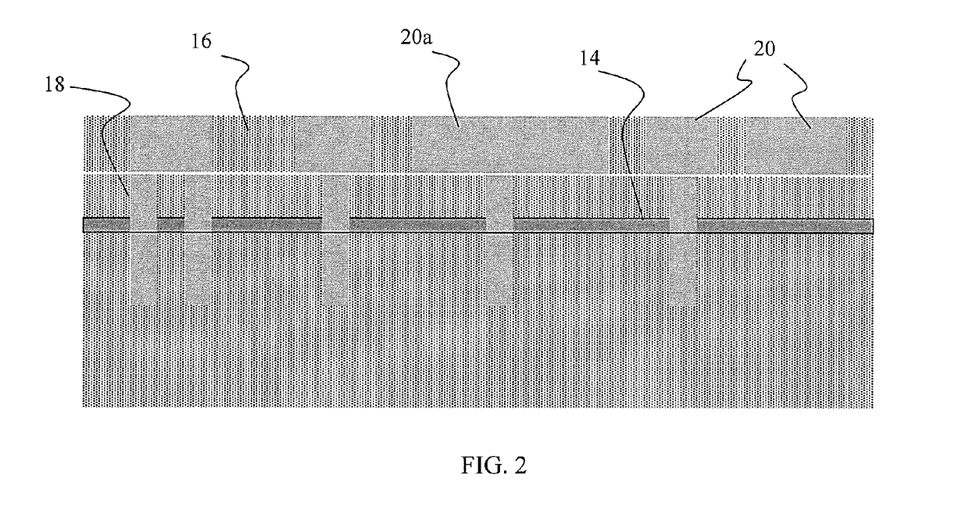

In FIG. 2, a SiN layer 14 is deposited over the dielectric layer 10, using any conventional deposition method such as, for example, CVD. A second inter metal dielectric layer 16 is deposited on the SiN layer 14, in a similar manner as described above with reference to the dielectric layer 10. Using a single or dual damascene process known to those of skill in the art, wiring layers 18 and 20 are formed in the SiN layer 14 and the dielectric layer 16, making contact with the underlying metal wiring layer 12. The wiring may be, for example, copper wiring. In embodiments, using 0.13 micron technology, for example, the wiring layer 20 will have a minimum dimension of about 0.4 micron tall and wide profile (although, other dimensions are contemplated by the invention).

As will become evident below, the metal wiring layer 20a, will be a bottom electrode of the switch, e.g., force electrode. As such, the MEMS switch advantageously uses the wiring layer 20a for a part of the MEMS switch, saving processes costs and time. In other embodiments, the other patterns in the metal wiring layer 20 can be used as the force electrode, depending on the placement and application of the switch.

Figure 3:
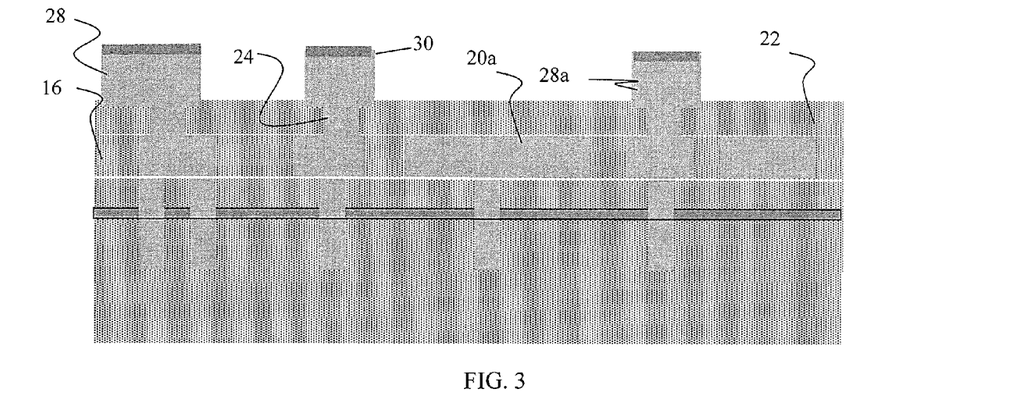

As shown in FIG. 3, dielectric layer 22 is deposited on the structure of FIG. 2. The dielectric layer 22 may be about 0.5 microns in height, and deposited using conventional techniques such as those described above. Thereafter, wiring layers 24, 28 are formed using conventional processes. For example, using conventional lithographic and etching processes, vias are formed in the dielectric layer 22. Conductive material is blanket deposited on the dielectric layer 22, including within the vias. The conductive material may be Al, Cu, AlCu TaN, Ta, or TiN, for example.

In embodiments, a thin layer of gold 30 can be deposited on the conductive material. In embodiments, the thin layer of gold 30 is approximately 100 nm; although, other dimensions are contemplated by the invention. Any known method can be used to deposit the gold, such as physical vapor deposition (PVD), metal-organic chemical vapor deposition (MOCVD), evaporation, electroplating, or the like.

Once the wiring layer 28 is deposited, it can be patterned using conventional lithography and etching processes to form the pattern shown in FIG. 3, for example. The pattern includes a wiring 28a that will act as a lower electrode for the MEMS switch. It should be understood by those of skill in the art that different patterns are also contemplated by the present invention. In embodiments, a gold wet etch selective to the underlying metal, e.g., TiN or AlCu, can be used to pattern the wires 28. In alternate embodiments, the wires 28 can be selectively plated with gold, post RIE and clean.

Figure 4:
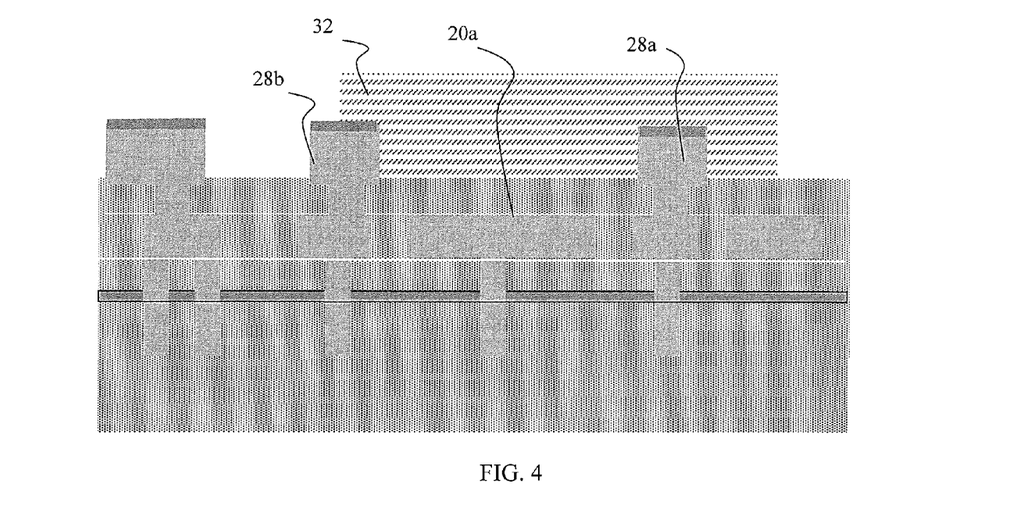

In FIG. 4, an organic polymer is deposited on the structure of FIG. 3. The organic polymer 32 can be, for example, Polymethylglutarimide (PMGI) or photosensitive polyimide (PSPI). PMGI is compatible with most g-line, i-line, and DUV photoresists and has excellent adhesion to Si, SiN, NiFe, Cu, Au, GaAs, and other III-V/III-VI materials. PMGI also exhibits a high thermal stability and can be applied in any conventional manner such as, for example, spin-coating. In embodiments, the organic polymer extends over the wiring 20a and 28a and partially over wiring 28b. In embodiments, the organic polymer 32 can be about 50 microns wide and about 200 microns long. Also, prior to the deposition of the organic polymer 32, the wiring layers can optionally be coated with $SiO_2$. Coating the wires with a layer of $SiO_2$ would facilitate the subsequent formation of MEMS switch capacitors instead of switches.

Figure 5:
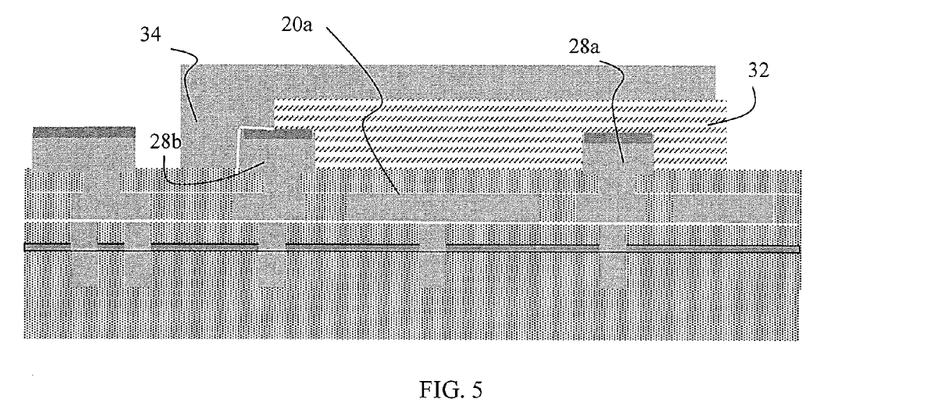

As shown in FIG. 5, a conductive material 34 is formed on the organic polymer 32 and is in contact with the exposed portion of the wiring 28b to form a cantilever beam, e.g., an upper electrode of the switch. The conductive material in the upper electrode of the switch could be formed by, for example, depositing, patterning, and etching; or by patterning, depositing, and using a lift off method. The cantilever beam 34 extends past the wiring layer 28 which will form a forcing electrode of the switch. In embodiments, the cantilever beam 34 is approximately 100 microns long and 10 microns thick to provide a certain rigidity to the structure; although, other dimensions are also contemplated by the present invention.

The cantilever beam 34 also extends above the wiring 20a, e.g., forcing electrode, by a predetermined distance. In one embodiment, the predetermined distance between the wiring 20a and a bottom surface of the cantilever beam 34 is about eight microns; although other dimensions are also contemplated by the invention. The eight micron dimension ensures that the wiring 20a can force the cantilever beam 34 downwards, in contact with the lower electrode 28a (formed from the patterned wire 28). Also, the distance between the cantilever beam 34 and the lower electrode 28a is about five microns.

In embodiments, the material for the cantilever beam 34 can be any conductive material such as, for example, Al, Ti, TiN, Cu or gold or any combination thereof. In embodiments, the cantilever beam 34 can be, for example, an electroplated (ECP) gold with a refractory liner on an underside thereof. In still further embodiments, the cantilever beam 34 can be AlCu with a gold liner on an underside thereof, formed using conventional processes such as PVD. In still another alternate embodiment, the cantilever beam 34 can be AlCu with an ECP gold coating. In this latter embodiment, the ECP gold coating can be formed on an underside of the cantilever beam 34, or both an underside and top surface of the cantilever beam 34. Although the wires are referred to as AlCu, it is understood that thin layers of refractory metal, such as TiN, are generally used above and below the AlCu, as is known in the art.

Figure 6:
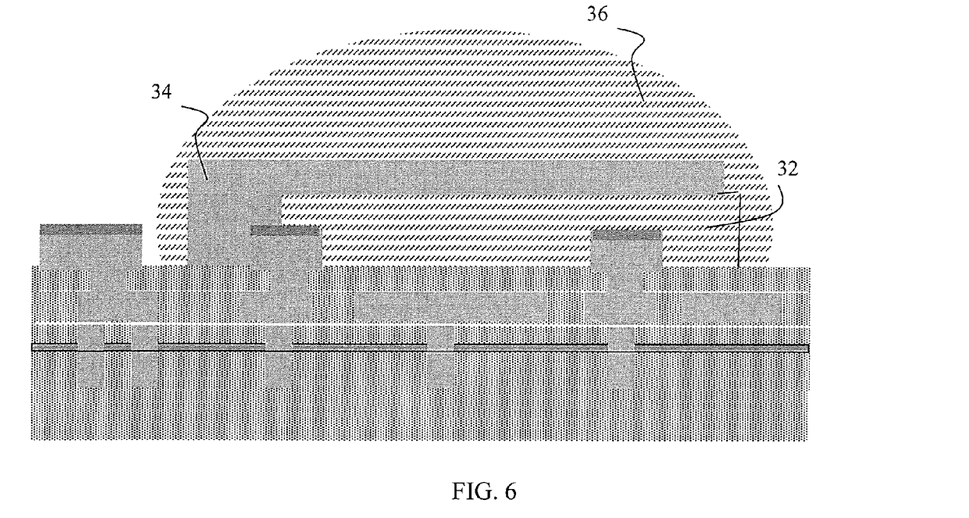

In FIG. 6, a sacrificial polymer 36 is deposited on the structure of FIG. 5. The sacrificial polymer 36 can be, for example, PSPI or PMGI. The sacrificial polymer 36 can thus be the same material as used for the organic polymer 32, or a different material.

Figure 7:
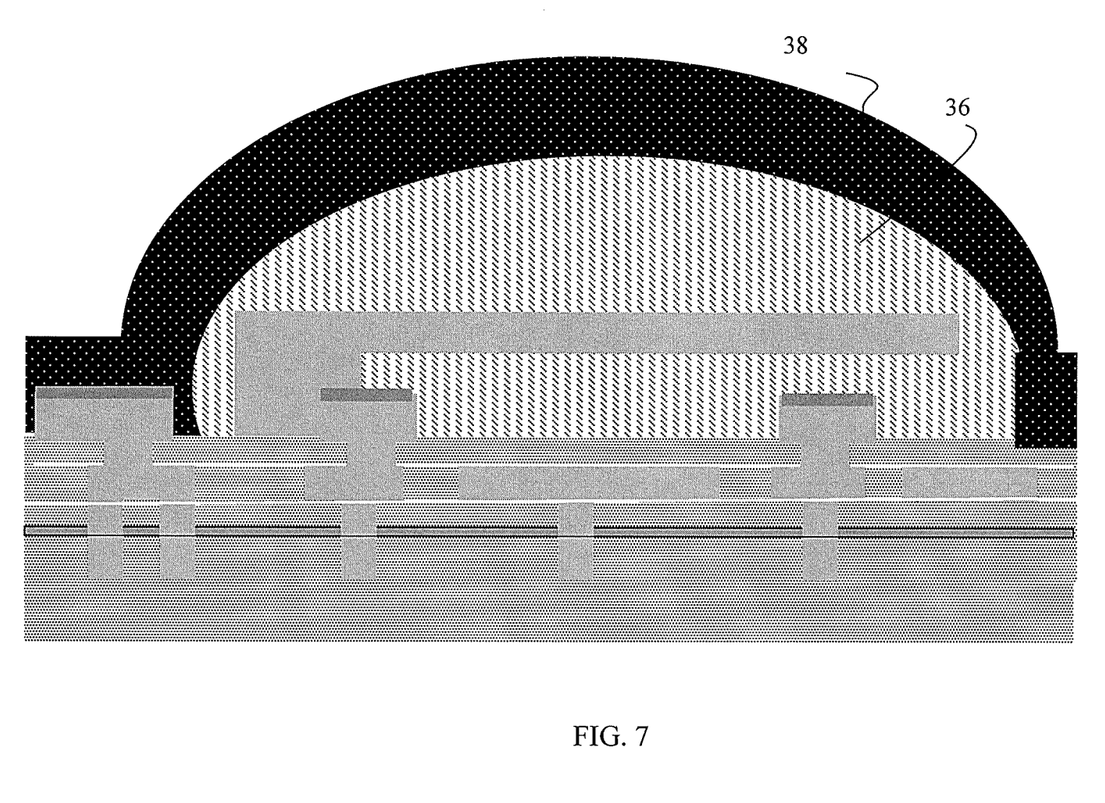

In FIG. 7, a cap 38 is formed over the structure of FIG. 6. More specifically, the cap 38 is a hard cap such as, for example, a SiN liner that is deposited on the sacrificial polymer 36 and other portions of the structure. The deposition of the SiN liner can be by any conventional deposition processes such as, for example, CVD or PVD processes. In embodiments, the cap 38 is about 6 microns thick.

Figure 8:
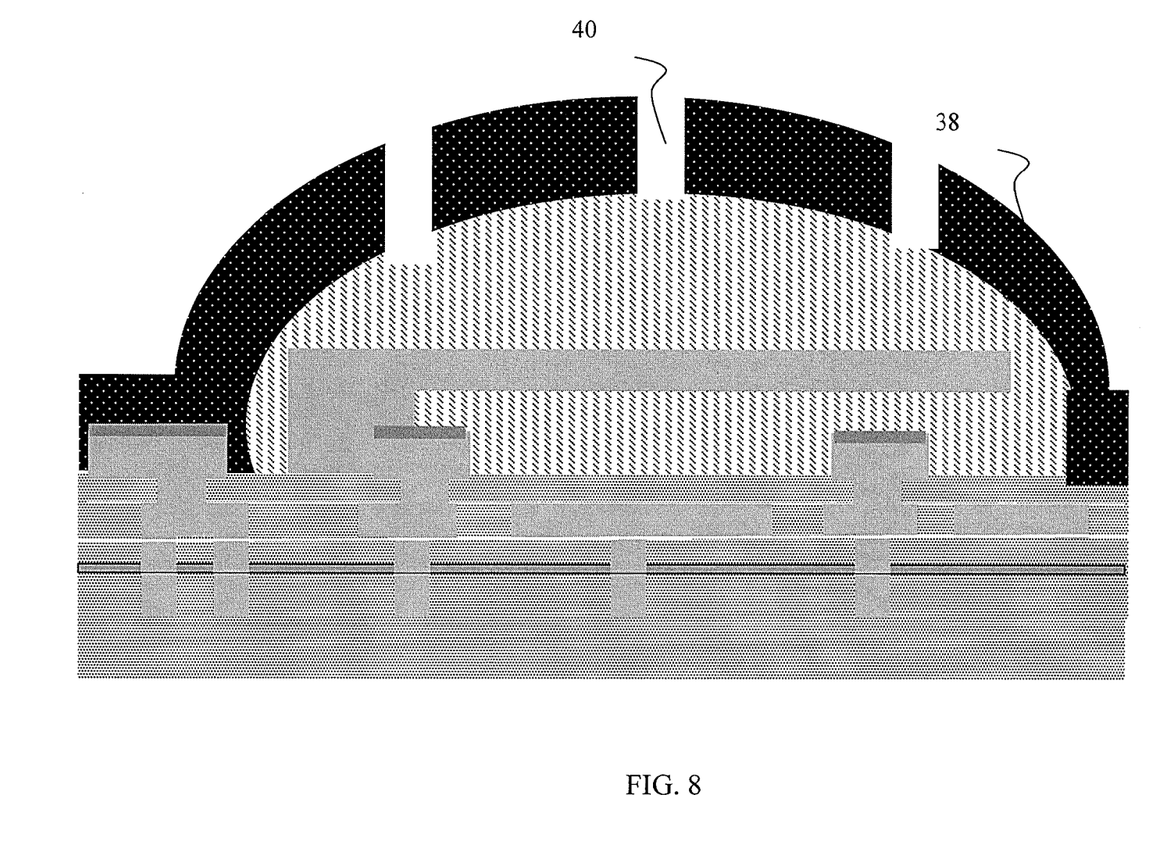

FIG. 8 shows an etching process in accordance with the invention. More specifically, in FIG. 8, openings 40 are formed in the cap 38 using conventional etching processes such as, for example, RIE. The openings 40, in embodiments, are spaced approximately evenly apart. This spacing can be, for example, about 4 microns. The openings can be about 1 micron wide and about 100 microns long. Those of skill in the art will readily recognize, though, that other dimensions are also contemplated by the present invention.

Figure 9:
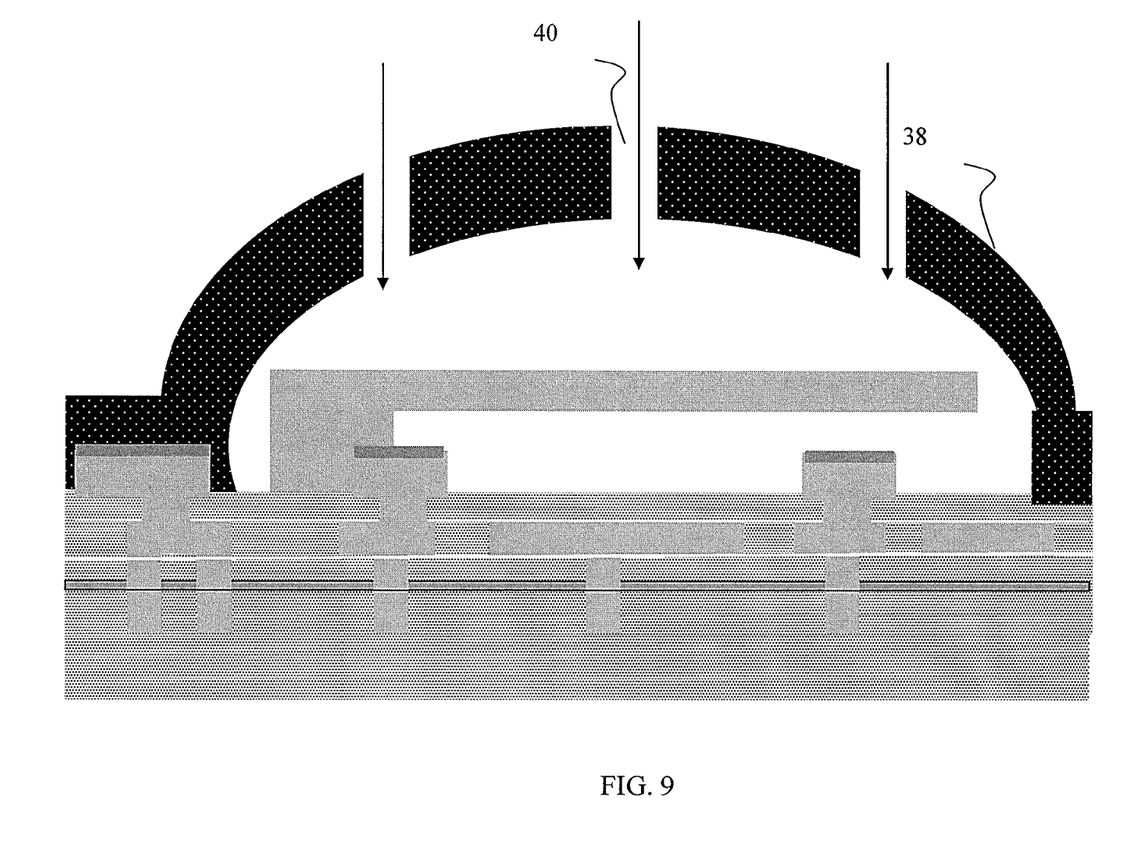
Figure 10:
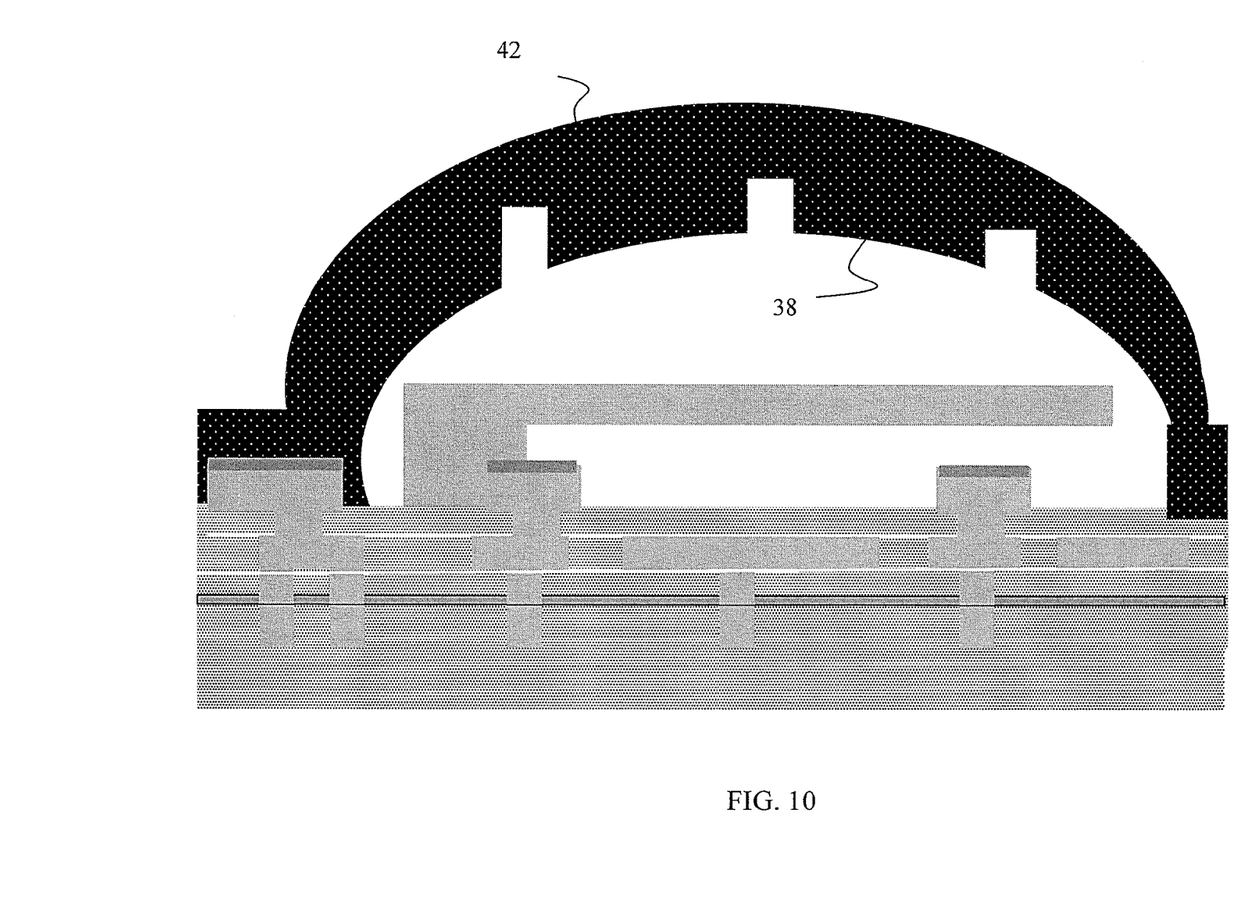
FIG. 10 shows a final MEMS structure and respective processing steps in accordance with a first aspect of the invention.

As shown in FIG. 9, the polymer (layers 32, 36) is stripped resulting in a void within the cap 38. For example, the polymer can be stripped using a dry or wet etch chemistry, through the openings 40. More specifically, in the case of PMGI, for example, the PMGI can be stripped in N-methyl-2-pyrrolidine (NMP) and dimethylsulfoxide (DMSO)-based removers. Also, PMGI is DUV, E-beam, and x-ray sensitivity, as well as exhibits a high etch rate in oxygen plasma as used in a downstream asher, high density plasma RIE chamber, or parallel plate RIE chamber. As mentioned previously, other sacrificial materials, such as silicon deposited by any known method, i.e. PVD, CVD, etc., could be used. If silicon was used for the sacrificial material, then it would be removed using a lateral downstream silicon etch tool, for example one using $XeF_2$ gas, as known in the art. Additionally, if silicon was used as the sacrificial material, exposed wire and via surfaces to the silicon etchant gas or liquid would need to be coated in a dielectric or conductor which is not etched by the silicon etch, prior to the silicon etch.

FIG. 10 shows the final structure and respective processing steps in accordance with the first aspect of the invention. In particular, the openings are sealed by a deposition of a SiN material 42, using a conventional deposition process. The SiN material 42 may be, for example, about 2 microns thick. In this way, the MEMS switch is hermetically sealed within the cap 38, 42.

Figure 11:
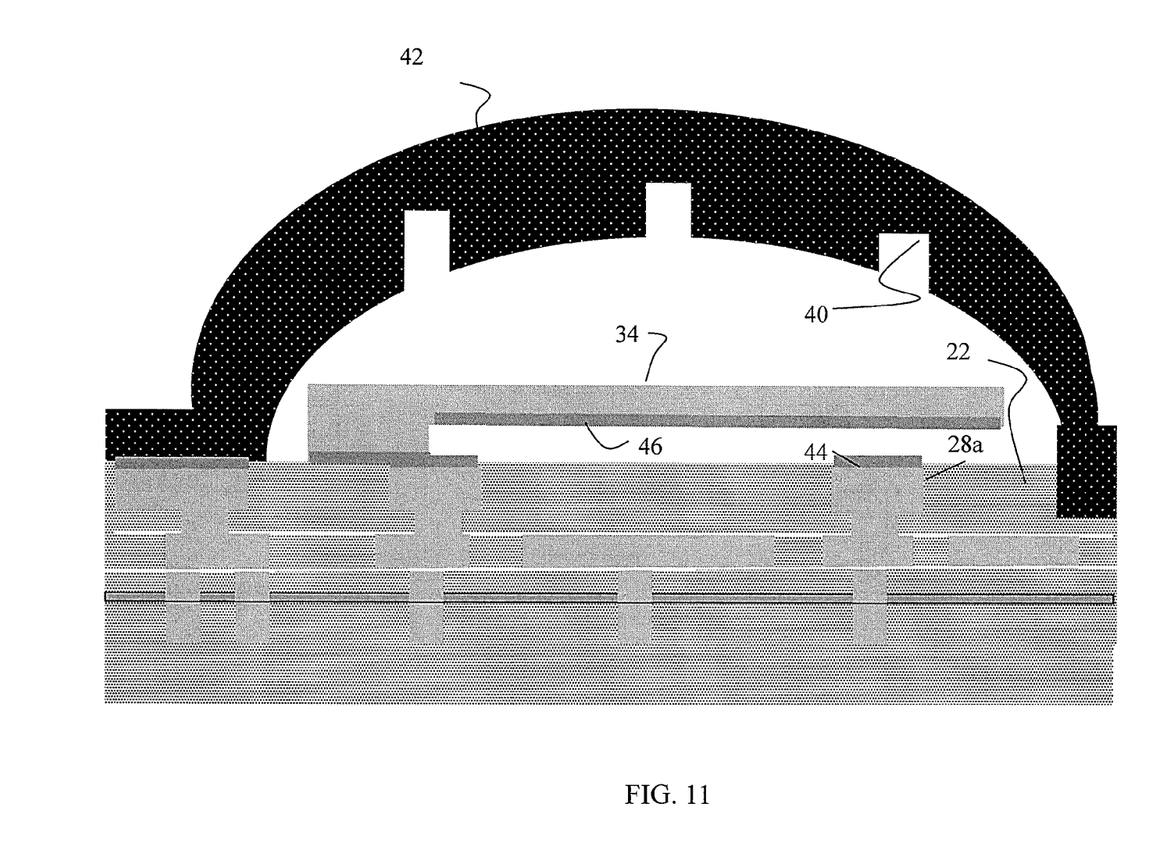
FIG. 11 shows a final MEMS structure and respective processing steps in accordance with a second aspect of the invention.

FIG. 11 shows a final structure and respective processing steps in accordance with the second aspect of the invention. In this embodiment, the wiring layer 28 is completely or mostly buried in the dielectric layer 22. An optional refractory material 44 such as, for example, CoWP, is deposited on the wiring layer 28, followed by a gold (Au) layer, for example. In embodiments, the Au layer 44 can be an ECP Au layer selective to CoWP about 0.5 microns thick. The wiring layer 28 can then be patterned as discussed above to form the lower electrode 28a. For example, in this embodiment, an Au wet etch selective to TaN or AlCu may be performed to pattern the wiring layer 28, using known chemistries. An Au layer 46 can be deposited on the underside of the cantilever beam 34.

Figure 12:
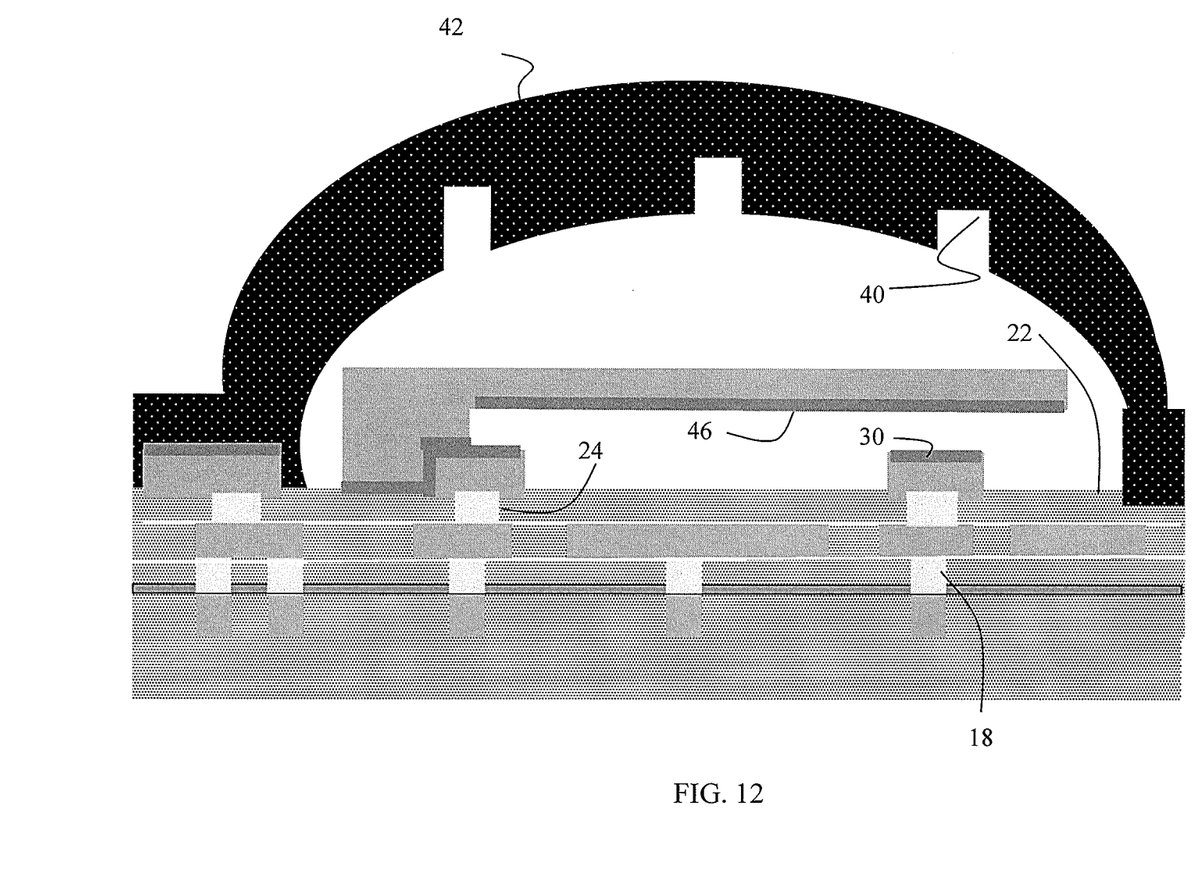
FIG. 12 shows a final MEMS structure and respective processing steps in accordance with the third aspect of the invention.

FIG. 12 shows a final structure and respective processing steps in accordance with the second aspect of the invention. In this embodiment, the wiring layer 28 is above the dielectric layer 22 and may be plated with gold (Au) 30 using any of the processes discussed herein. In embodiments, a refractory material such as, for example, CoWP, can be deposited below the Au layer 30 on the wiring layer 28. The wiring layer 28 can then be patterned as discussed above to form the lower electrode 28a. For example, the patterning of the wiring layers can be performed using any known chemistries, such as those discussed herein.

An Au layer 46 can be deposited on the underside of the cantilever beam 34. Additionally, the wiring layers 18 and 24 can be tungsten studs and the remaining wiring layers can be, for example, Al, Cu or AlCu (as can be in any embodiment).

As should now be understood in view of the above discussion, the present invention uses existing wiring layers in a device, e.g., CMOS, for the MEMS switch. That is, a forcing electrode can be formed from a lower wiring layer of the device and a lower electrode contact can be formed from an upper wiring layer of the device. A flexible cantilever arm is formed over the forcing electrode and the lower electrode, and in contact with a patterned wire of the device. In use, upon application of a voltage to the forcing electrode, the flexible cantilever arm will contact the lower electrode to close the MEMS switch.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method of manufacturing a MEMS switch, comprising:
   forming a forcing electrode from a lower wiring layer of a device;
   forming a lower electrode from an upper wiring layer of the device;
   depositing a gold layer on a conductive material forming the lower electrode prior to patterning the conductive material;
   depositing a refractory material between the conductive material forming the lower electrode and the gold layer prior to the patterning; and
   forming a flexible cantilever arm over the forcing electrode and over the lower electrode such that upon application of a voltage to the forcing electrode, the flexible cantilever arm will contact the lower electrode to close the MEMS switch.

2. The method of claim 1, wherein the forcing electrode and the lower electrode are copper wiring levels of the device.

3. The method of claim 1, wherein the forcing electrode is embedded in a dielectric layer formed by a damascene process.

4. The method of claim 1, wherein the lower electrode is formed by performing the patterning of a deposited layer of the conductive material on a dielectric layer.

5. The method of claim 1, wherein the flexible cantilever arm is formed by:
   depositing a sacrificial material over a dielectric material and the lower electrode; and
   depositing a conductive material on the sacrificial material.

6. The method of claim 5, wherein the conductive material is at least one of Cu, Au, TiN, and Al and the sacrificial material is one of polymer and silicon.

7. The method of claim 1, further comprising hermetically sealing the flexible cantilever arm comprising:
   depositing a sacrificial layer on the flexible cantilever arm and on a sacrificial material used in the formation of the flexible cantilever arm;
   capping the sacrificial layer with a deposited hard cap material;
   opening holes in the hard cap material;
   stripping the sacrificial layer and the sacrificial material; and
   sealing the holes.

8. A MEMS switch, comprising:
   a lower wiring layer of a device acting as forcing electrode;
   an upper wiring layer of the device acting as a lower electrode contact, the lower electrode contact comprising a conductive material;
   a refractory material formed on the conductive material;
   a gold layer formed on the refractory material such that the refractory material is between the conductive material forming the lower electrode and the gold layer; and
   a cantilever arm positioned above the forcing electrode and the lower electrode contact such that upon application of a voltage to the forcing electrode, the cantilever arm contacts the lower electrode contact to complete a circuit for the MEMS switch,
   wherein the refractory material and the gold layer are formed prior to patterning of the conductive material to form the upper wiring layer.

9. The MEMS switch of claim 8, wherein the MEMS switch is hermetically sealed.

10. The MEMS switch of claim 9, wherein the hermetic seal is a SiN cap layer that has sealed openings.

11. The MEMS switch of claim 8, wherein the cantilever arm is at least one of Al, Cu, AlCu and Au and TiN.

12. The MEMS switch of claim 8, wherein the cantilever arm is about 10 microns thick and spaced from the lower electrode contact at a distance of about 5 microns and the forcing electrode at a distance of about 8 microns.

13. A method of manufacturing a MEMS switch, comprising:
   forming a forcing electrode from a lower wiring layer of a device;

forming a lower electrode from an upper wiring layer of the device;

forming another patterned wiring from the upper wiring layer;

depositing a gold layer on the another patterned wiring and the lower electrode of the upper wiring layer;

depositing a refractory material between the gold layer and the lower electrode;

forming a flexible cantilever arm over the forcing electrode and over the lower electrode such that upon application of a voltage to the forcing electrode, the flexible cantilever arm will contact the lower electrode to close the MEMS switch; and depositing another gold layer on an underside surface of the flexible cantilever arm.

14. The method of claim 13, wherein the flexible cantilever arm is formed in contact with the another patterned wiring of the upper wiring layer of the device.

15. The method of claim 14, wherein the flexible cantilever arm extends past the lower electrode.

16. The method of claim 15, wherein the flexible cantilever arm is spaced from the lower electrode.

17. The method of claim 16, wherein the lower electrode and the upper wiring layer of the device are completely buried in a dielectric layer.

* * * * *